(12) United States Patent
Zundel et al.

(10) Patent No.: US 7,372,103 B2
(45) Date of Patent: May 13, 2008

(54) MOS FIELD PLATE TRENCH TRANSISTOR DEVICE

(75) Inventors: Markus Zundel, Egmating (DE); Franz Hirler, Isen (DE)

(73) Assignee: Infineon Technologies Austria AG, Siemensstr, Villach (AT)

( * ) Notice: Subject to any disclaimer, the term of this patent is extended or adjusted under 35 U.S.C. 154(b) by 132 days.

(21) Appl. No.: 11/395,103

(22) Filed: Mar. 31, 2006

(65) Prior Publication Data

US 2006/0258105 A1 Nov. 16, 2006

(30) Foreign Application Priority Data

Mar. 31, 2005 (DE) .................. 10 2005 014 743

(51) Int. Cl.
*H01L 29/76* (2006.01)
(52) U.S. Cl. ................ 257/330; 257/409; 257/E29.009
(58) Field of Classification Search ................ 257/327, 257/328, 330, 409, E29.009
See application file for complete search history.

(56) References Cited

U.S. PATENT DOCUMENTS

| | | | | |
|---|---|---|---|---|
| 6,413,822 B2* | 7/2002 | Williams et al. | ............ | 438/270 |
| 6,882,004 B2* | 4/2005 | Zundel et al. | ............... | 257/327 |
| 6,911,693 B2* | 6/2005 | Zundel et al. | ............... | 257/332 |
| 7,253,042 B2* | 8/2007 | Disney | ........................ | 438/197 |
| 2006/0214222 A1* | 9/2006 | Challa et al. | ............... | 257/328 |

* cited by examiner

*Primary Examiner*—T. N. Quach
(74) *Attorney, Agent, or Firm*—Dicke, Billig & Czaja, PLLC

(57) ABSTRACT

A MOS field plate trench transistor device is disclosed. In one embodiment, in order to obtain a lowest possible on resistance, in the case of a MOS field plate trench transistor device having a body contact hole, it is proposed to form the avalanche breakdown region preferably in an end region of a provided trench structure by virtue of the fact that a mesa region with the body contact region in the semiconductor region as intermediate region in a direction running perpendicular to the first direction and with respect to an adjacent MOS transistor device has a width $D_{Mesa}$, the value of which corresponds to the value of the width $D_{Trench}$ of the trench structure in this direction or exceeds said value and does not go beyond 1.5 times said value, so that the following holds true: $D_{Trench} \leq D_{Mesa} \leq 1.5 \cdot D_{Trench}$. As an alternative, the width $D_{Mesa}$ is chosen such that the body contact hole precisely still has space, but the breakdown region is in any event shifted into the end region.

23 Claims, 3 Drawing Sheets

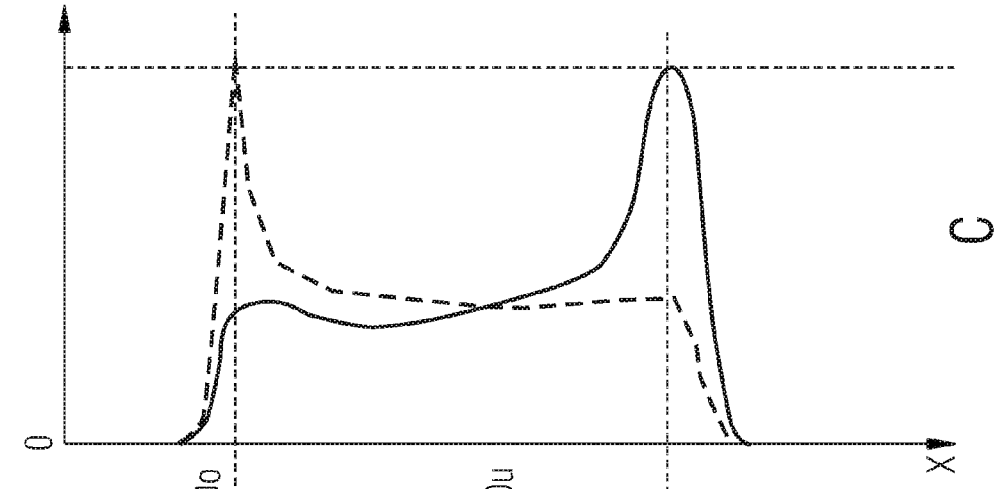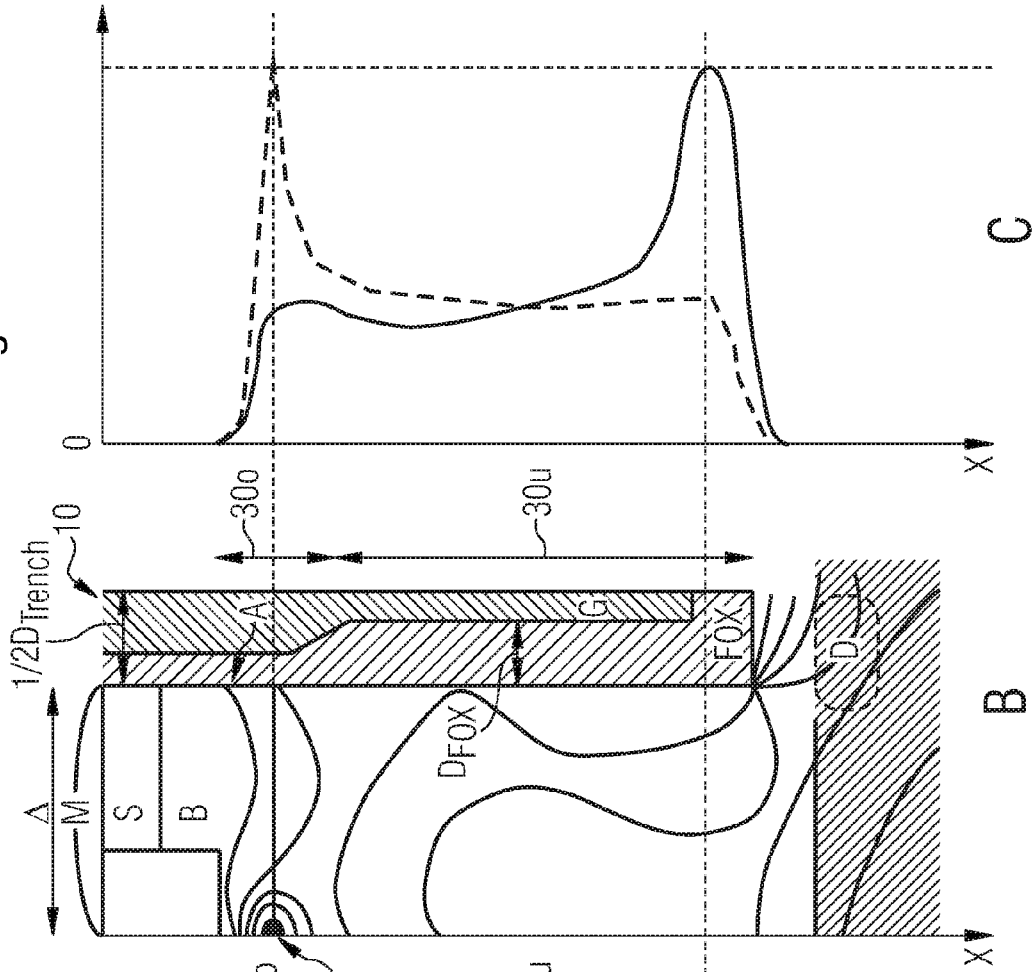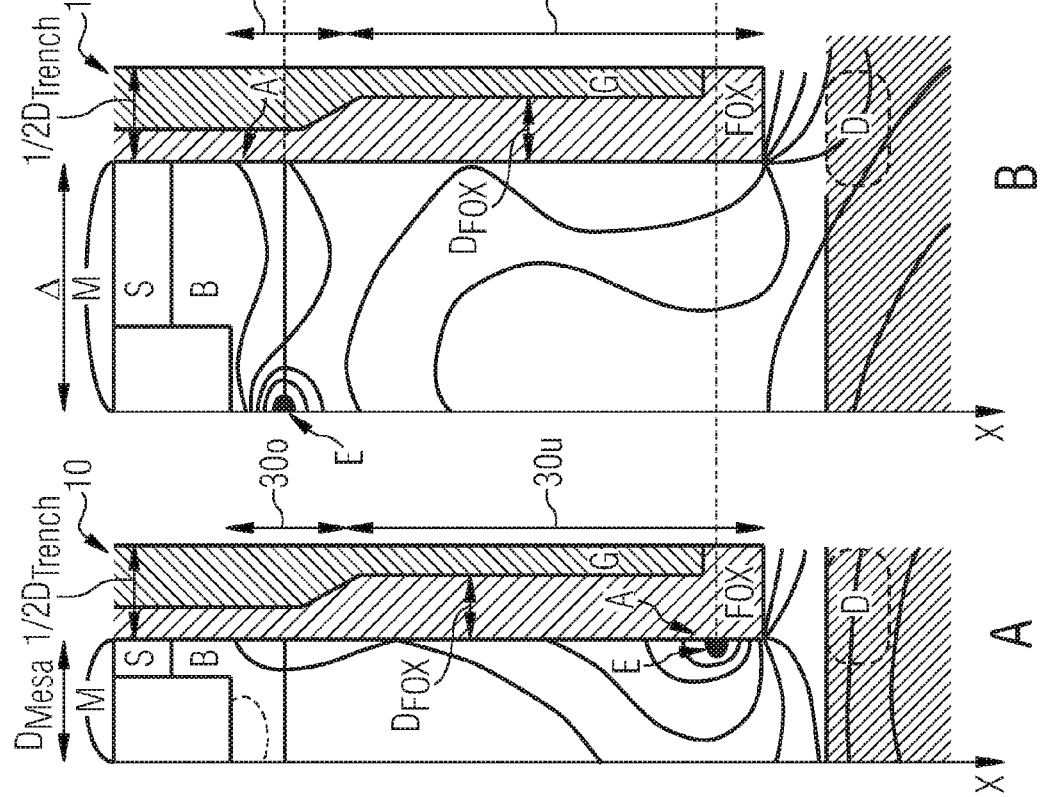

MOS FIELD PLATE TRENCH TRANSISTOR DEVICE

CROSS-REFERENCE TO RELATED APPLICATIONS

This Utility Patent Application claims priority to German Patent Application No. DE 10 2005 014 743.7, filed on Mar. 31, 2005, which is incorporated herein by reference.

BACKGROUND

The present invention relates to a MOS field plate trench transistor device (also called "MOS transistor device" for short hereinafter). As is known, a field plate trench is understood to be a trench with a thin gate oxide and a gate electrode in the upper region of the trench and a thick field oxide and a field plate in the lower region of the trench.

In modern MOS transistors, particularly in the power semiconductor sector, the area-specific on resistance $R_{on} \cdot A$ is an essential criterion in assessing the function of the respective MOS transistor.

The further development of modern transistor technologies often aims to reduce the area-specific on resistance $R_{on} \cdot A$, so that, on the one hand, the static power loss can be minimized and, on the other hand, greater current densities can be achieved, which can result in the possibility of miniaturization of the chips in conjunction with cost-effective production.

Known measures for reducing the on resistivity of MOS transistors use trench cells instead of a planar cell structure, in which trench cells the MOS transistor is formed in the region of a trench structure that accommodates the gate electrode and the gate connection. As a result of this measure, the channel resistance, in particular, is reduced as a result of the increase in the channel width. Furthermore, the resistance of the drift path can be reduced further by using deep trench structures. Specific doping measures reduce the drift path resistance further.

For these and other reasons, there is a need for the present invention.

SUMMARY

The present invention provides a MOS field plate trench transistor device is disclosed. In one embodiment, in the case of a MOS field plate trench transistor device having a body contact hole, the avalanche breakdown region is formed in an end region of a provided trench structure by virtue of the fact that a mesa region with the body contact region in the semiconductor region as intermediate region in a direction running perpendicular to the first direction and with respect to an adjacent MOS transistor device has a width $D_{Mesa}$, the value of which corresponds to the value of the width $D_{Trench}$ of the trench structure in this direction or exceeds said value and does not go beyond 1.5 times said value, so that the following holds true: $D_{Trench} \leq D_{Mesa} \leq 1.5 \cdot D_{Trench}$. As an alternative, the width $D_{Mesa}$ is chosen such that the body contact hole precisely still has space, but the breakdown region is in any event shifted into the end region.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The invention is explained in more detail below on the basis of preferred embodiments with reference to a schematic drawing.

FIGS. 2A, 2B, and 2C qualitatively illustrate the field strength distribution in an embodiment of the MOS transistor device according to the invention, in a MOS transistor device from the prior art, and a graph representing the profile of the magnitude of the electric field strength in the mesa region as a function of the depth in the semiconductor material.

DETAILED DESCRIPTION

Figure 1:
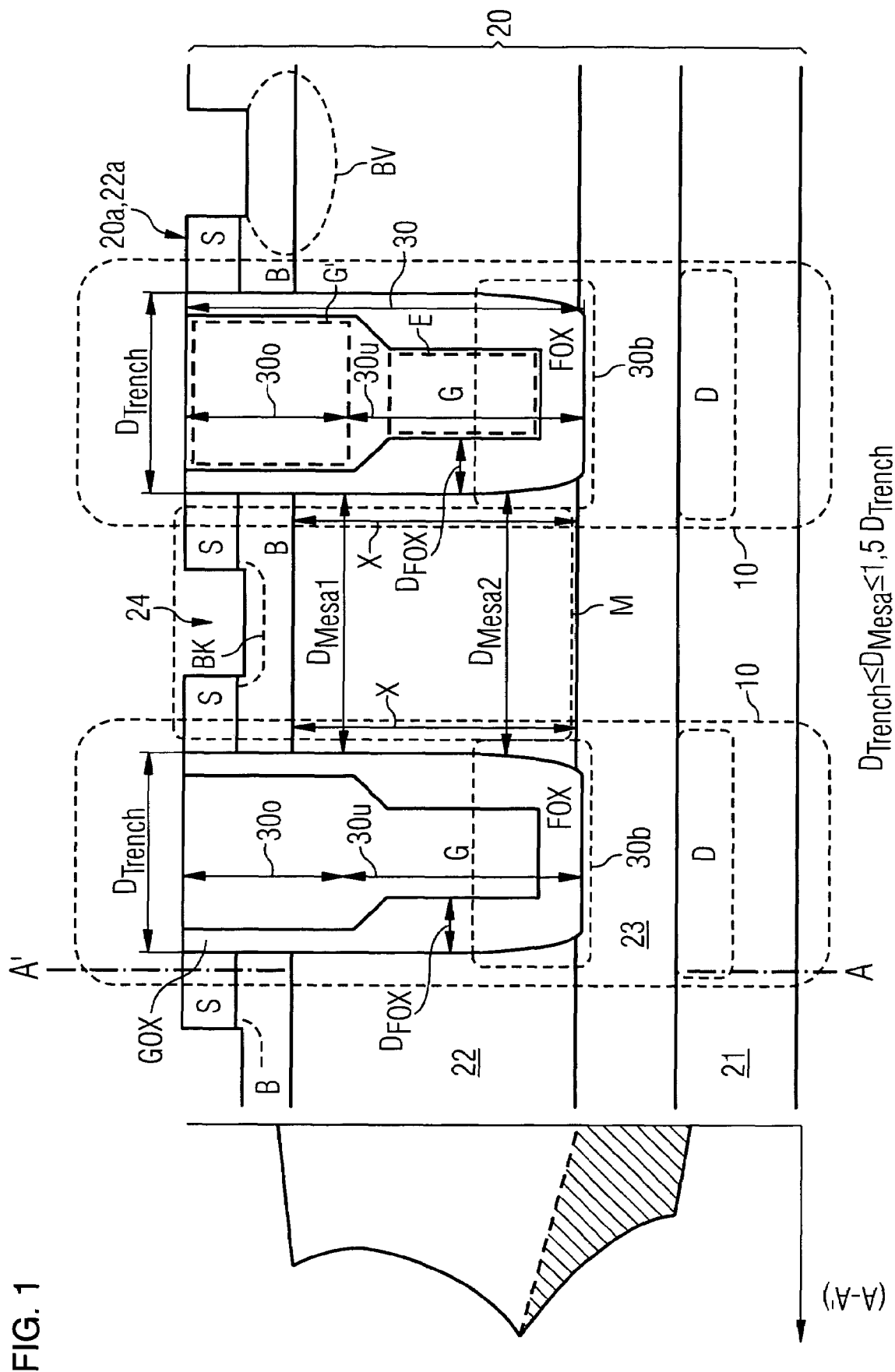
FIG. 1 illustrates one embodiment of a MOS transistor device according to the invention in schematic and sectional side view.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a MOS field plate trench transistor device in which particularly low on resistances can be provided in conjunction with functional reliability.

In one embodiment, the present invention includes a MOS field plate trench transistor device having a trench structure extending in a first direction in a semiconductor region. A source region and a drain region are formed in the semiconductor region with a first conductivity type and, between these regions, a body region is formed with a second conductivity type. A gate electrode device is formed in the interior of the trench structure in a manner insulated by an insulation region. Furthermore, the invention provides a mesa region in the semiconductor region as intermediate region in a direction running perpendicular to the first direction and with respect to an adjacent MOS transistor device, said mesa region having a width $D_{Mesa}$, the value of which corresponds to the value of the width $D_{Trench}$ of the trench structure in this direction or exceeds said value and does not go beyond 1.5 times said value, so that the following holds true:

$$D_{Trench} \leq D_{Mesa} \leq 1.5 \cdot D_{Trench}.$$

In this case, the width $D_{Mesa}$ is given by the average value of the width of the mesa region at the level of the pn junction between the body region and the drain region and the width of the mesa region at 80% of the depth of the trench structure. Situated in the mesa region is a contact hole to the body region, the contact hole being filled with a suitable contact material, such as metal or polycrystalline silicon (polysilicon). In this case, the contact hole may be formed globally along the trench structure.

Preferably, the avalanche breakdown region of the MOS transistor device is thereby formed in an end region or a lower region of the trench structure, in particular in the region of the bottom thereof, so that a particularly low on resistance of the MOS transistor device is formed or can be formed as a result.

Consequently, a first basic concept according to the invention is to form the avalanche breakdown region of the MOS transistor device according to the invention preferably in an end region of the trench structure. This may be achieved by the provision of a mesa region provided with a contact hole to the body region in the semiconductor region as intermediate region in a direction running perpendicular to the first direction and with respect to an adjacent MOS transistor device, the mesa region having a width $D_{Mesa}$, the value of which corresponds to the value of the width $D_{Trench}$ of the trench structure in this direction or exceeds said value and does not go beyond 1.5 times said value, so that the following holds true:

$$D_{Trench} \leq D_{Mesa} \leq 1.5 \cdot D_{Trench}.$$

A second basic concept of the invention provides for using, in the case of a MOS field plate trench transistor device having a contact hole to the body region, the contact hole being located in the mesa region, the width $D_{Mesa}$ of the mesa region and the width $D_{Trench}$ of the trench structure such that, on the one hand, the width $D_{Mesa}$ is reduced to such a great extent that an avalanche breakdown is effected in the bottom region of the trench structure and that, on the other hand, the width $D_{Mesa}$ is reduced only to an extent such that the body region contact hole can still be accommodated.

In the case of a vertical MOS transistor device having a correspondingly vertically oriented trench structure, a lower region of the trench structure, in particular, is provided as bottom or end region in this case.

The so-called avalanche strength or the breakdown voltage of the MOS transistor device according to the invention is increased as a consequence of the avalanche breakdown region being shifted into the end region or lower region of the trench structure. The increase in the breakdown voltage as a result of the avalanche breakdown region being shifted into the lower region or end region of the trench structure can be used to raise the concentration of the corresponding surrounding doping, in particular of the epitaxial zone. In this case, part of the increase in the breakdown voltage is lost again. This can be accepted, however, since the breakdown voltage used for operation lies below the increased breakdown voltage. A higher doping that can then be carried out, in particular of the epitaxial zone, decreases the on resistance of the MOS transistor device according to the invention in the intended manner.

In one preferred embodiment of the MOS transistor device according to the invention, a global body contact device is or remains provided for a plurality of body contact holes.

The basic idea of forming the avalanche breakdown region of the MOS transistor device according to the invention in an end region or lower region, in particular bottom region of the trench structure, can be realized in various ways.

One preferred embodiment provides for the avalanche breakdown region to be formed or defined by a region of maximum electric field strength.

This can be ensured for example by the corresponding arrangement of the source and/or drain connections and/or the proximity to other devices because the respective MOS transistor device is generally not situated alone in the respective semiconductor region, but rather in direct proximity to other semiconductor devices, for example other transistors.

In this case, in particular in accordance with a preferred embodiment of the invention, the region of maximum electric field strength may be formed between the source region and the drain region in direct proximity to the insulation region and in direct proximity to the end region or lower region of the trench structure in a manner facing away from the gate electrode. In particular, in this case the region of maximum electric field strength lies directly at the outer side of the trench wall in the lower region of the trench structure, that is to say for example in the vicinity of the trench bottom.

Another embodiment of the MOS transistor device according to the invention provides for the region of maximum field strength to be formed between the source region and the drain region in direct proximity to the end region or lower region of the trench structure and in a manner facing away from the gate electrode device. This is preferably done in the region of a space charge zone, which extends in particular between a provided body region or a provided body reinforcement region and the drain region, in particular when the breakdown voltage is present.

In a particularly preferred embodiment of the MOS transistor device according to the invention, it is provided that the mesa region as intermediate region in a direction running essentially perpendicular to the first direction, in particular toward an adjacent semiconductor device, has a width $D_{Mesa}$, the value of which, in addition to the two basic concepts above, corresponds to 2.5 times the value of the maximum thickness $D_{FOX}$ of the insulation region or the value of which exceeds 2.5 times said value and does not go beyond 7.5 times said value, so that $$2.5 \cdot D_{FOX} < D_{Trench} \leq D_{Mesa} \leq 7.5 \cdot D_{FOX}.$$

As a result of this measure of constricting the mesa width and thus the closer proximity of adjacent components, this therefore achieves not only a higher integration density of the semiconductor components, but also the invention's reduction of the on resistances of MOS transistor devices according to the invention.

It should be taken into account that the mesa width $D_{Mesa}$ is permitted to be restricted only to the extent allowed by the interaction of adjacent semiconductor devices or semiconductor components. The electric fields of adjacent semiconductor components that are separated by the mesa region respectively provided must not influence one another in such a way that a negative tendency arises with regard to the breakdown voltage.

The body region may advantageously be formed toward the drain region with a body reinforcement region of the second conductivity type.

It is particularly preferred for the region of local maximum dopant concentration of the first conductivity type to be provided in the region of a position which lies in the transition from the body region or body reinforcement region to a doping spur of the drain region.

In a further advantageous embodiment of the MOS transistor device according to the invention, it is provided that the trench structure is formed such that it reaches approximately as far as the first semiconductor subregion of the semiconductor region or into this semiconductor subregion.

It is particularly advantageous if, between the bottom of the trench structure and the first semiconductor subregion, a field buffer zone is provided below the bottom region of the trench structure. As a result, the breakdown voltage is increased, and the avalanche strength is improved.

In another advantageous embodiment of the MOS transistor device according to the invention, it is provided that a plurality of electrodes or electrode devices are formed in the trench structure that is provided, if appropriate. Said electrodes or electrode devices may form in particular a plurality of gate regions and alternatively or additionally a plurality of source regions.

In a further advantageous embodiment of the MOS transistor device according to the invention, it is provided that the drain region or the connection region therefor, whilst avoiding to the greatest possible extent rear-side contact-connections of the semiconductor region, is formed on the same side of the semiconductor region as the source region or the connection region therefor, the first semiconductor subregion, in particular in highly n-doped form, serving as a connection zone and being formed in laterally offset fashion in a manner extending as far as the surface region of the semiconductor region or of the second semiconductor subregion thereof.

These and further aspects of the present invention are explained in more detail on the basis of the remarks below.

The present invention also relates, inter alia, to a so-called mixed-concept DMOS.

In the development of new generations of DMOS power transistors, one important aim is to reduce the on resistivity $R_{on} \cdot A$. By this means, on the one hand, the static power loss can be minimized and, on the other hand, higher current densities can be achieved, as a result of which smaller and less expensive chips can be used for the same total current. Furthermore, good avalanche properties are also to be ensured, but this usually requires a certain space requirement for a good body connection. It is therefore necessary to find an optimum compromise between low $R_{on} \cdot A$ and good avalanche properties, which is proposed in this idea.

One known method for reducing the on resistivity consists in departing from the planar cell structure and using trench cells. As a result, the channel resistance, in particular, is reduced by a significant increase in the channel width per area. The resistance of the drift path, that is to say the epitaxial resistance, can be reduced by using deep trenches as in the case of Temple, U.S. Pat. No. 4,941,026, wherein a field plate trench concept is proposed in the cells of which four possible breakdown locations are encountered. The latter are in the cell center below the body contact, at the field plate step, at the lateral trench bottom region and at the trench bottom itself. In the patent application DE 102 07 309.0 regarding the dense field plate trench, it is proposed, in order to fix the breakdown location, that the mesa width between the trenches be reduced to such a great extent that it is less than the trench width or less than 2.5 times the maximum oxide thickness in the trench. The consequence of this is that the breakdown location is fixed at the lateral trench bottom region, although this also has the consequence that the mesa width has become so small that it is no longer possible to introduce a body contact trench between the trenches. This in turn has the consequence that, for a good avalanche strength, body contact strips have to be introduced transversely with respect to the trenches, which cost some space in the direction of the trenches and, at the same time, the FOM—that is to say the product $R_{on} \cdot A \bullet Q_{Gate}/A$—deteriorates significantly.

It is proposed inter alia e.g. to reduce the mesa width in the case of field plate trench transistors—the drift zone is essentially depleted laterally by the field plates, there are two oxide thicknesses in the trench and the trench extends through the largest part of the drift zone—precisely to an extent such that the avalanche breakdown or the maximum of the electric field is effected in the silicon in the lower trench region, in particular that the mesa width in this case lies in the range of 1.0 times up to 1.5 times the trench width and the geometry of the mesa is in this case precisely still configured such that a global—the body contact is essentially embodied over the entire length of the mesa strip and not e.g., alternately with respect to source contacts—planar body contact structure or body contact trench structure can be introduced into the mesa between the trenches.

The major advantage of this idea over the prior art is that both the advantage of the significantly increased breakdown voltage in the dense trench regime with a relatively small space requirement and the advantage for very good avalanche strength of the traditional concept with a global body contact trench are combined and are thus optimized with regard to the FOM.

One aspect resides, in particular, inter alia (a) in the shifting of the breakdown location from the cell center—also in the case of body reinforcement implantation—or from the oxide edge into the region of the trench bottom by decreasing the mesa width to 1.0 times to 1.5 times the trench width and (b) in maintaining the global planar body contact or body contact trench for optimal avalanche strength in conjunction with an optimally low RonA.

These and other aspects are explained again below using different words.

In the development of new generations of MOS or DMOS power transistors, one important aim is to reduce the on resistivity $R_{on} \cdot A$. By this means, on the one hand, the static power loss can be minimized. On the other hand, higher current densities can be achieved, as a result of which smaller and less expensive chips can be used for the same total current.

One method for reducing the on resistivity consists in departing from the planar cell structure and using trench cells. As a result, the channel resistance, in particular, is decreased by an increase in the channel width per area. The resistance of the drift path (epitaxial resistance) can be reduced by using deep trenches. A doping that increases in the entire epitaxial zone is proposed in order to reduce the drift path resistance further.

It is also proposed that the mesa width in the case of field plate trench transistors be reduced to an extent such that the avalanche breakdown is effected in the silicon in the lower trench region, in particular the mesa width corresponding to the trench width or slightly exceeding the latter, extending at most, however, to 1.5 times the value of the trench width, and/or the mesa width assuming or exceeding the value of 2.5 times the maximum oxide thickness in the trench, extending at most, however, to 7.5 times the value of the maximum oxide thickness in the trench.

Transistors which are constructed according to the prior art tend, by contrast, to break down at the oxide edge. Special measures constrain a breakdown in the cell center.

Although a breakdown in the trench bottom region leads to charge carriers being incorporated into the oxide and to a drifting of the breakdown voltage, the drift saturates and therefore does not constitute a reliability problem. What is essential is that this does not bring about a drift of the threshold voltage.

FIG. 1 illustrates the lateral cross-sectional view of a semiconductor circuit arrangement using two MOS field plate trench transistor devices 10 (also called "MOS transistor devices" for short hereinafter) formed according to the invention.

The MOS transistor devices 10 formed according to the invention are formed adjacent to one another in a semiconductor region 20 or semiconductor material region 20 having a surface region 20a in a manner separated by a mesa region M having the width $D_{Mesa}$, to be precise in an essentially initially at most lightly doped first semiconductor partial region 22 thereof. Each MOS transistor device 10 formed according to the invention has a trench 30 or a trench structure 30 having the width $D_{Trench}$.

The wall regions of the trench structures 30 are lined with an insulation region GOX, e.g., with a gate oxide, in an upper region 30o and with an insulation region FOX, e.g., a field oxide, in a lower region 30u. The field oxide FOX has a maximum thickness $D_{FOX}$ in the lower region 30u of the trench structure 30. In the upper region 30o of the trench structure 30, the gate oxide GOX having a thickness $D_{GOX}$ is made very much narrower or thinner than the field oxide FOX having the thickness $D_{FOX}$, so that $D_{FOX} \gg D_{GOX}$ holds true.

Formed adjacent to the upper region 30o of the trench structure 30 is a source region S, here with an n-type doping. Situated underneath in oppositely p-doped fashion are a body region B and also a corresponding body reinforcement region BV, which is p-doped more heavily than the body region B. The body reinforcement region BV is preferably formed locally in regions of the contact hole 24. The body reinforcement region BV may be omitted, if appropriate. Provided below the first semiconductor partial region 22 and in a manner essentially adjoining the bottom of the trench structures 30 is a further, second semiconductor partial region 21 having n⁺-type doping, in particular a semiconductor substrate, in which or by which the respective drain region D of a respective MOS transistor device 10 is formed. The trench structure 30 may also extend right into region 21. Preferably, however, there is also an n-doped field buffer zone 23 situated between the region 21 and the region 22, said field buffer zone essentially being doped identically to the region 22. The trench structure 30 may extend as far as the zone 23 or into the latter.

In its interior, the respective trench structure 30 also has in each case a gate electrode G, so that the arrangement of source S, drain D and gate G with addition of the insulation regions GOX and FOX forms a vertical trench MOS transistor device 10.

A body contact hole 24 is provided between two adjacent trench structures 30, a body contact metal or a polysilicon plug (not illustrated) being introduced into said contact hole. Good contact-making is ensured by a body contact zone BK, which is p⁺-doped and thus more highly doped than the body region B.

In the vertical intermediate region between the drain region D, on the one hand, and source S, body region B and body reinforcement region BV, on the other hand, a region X is formed in the mesa region M of the respective MOS transistor device 10 according to the invention, said region X reducing the on resistance of the MOS transistor devices 10 according to the invention. The width $D_{Mesa}$ of the mesa region M is to be defined by $D_{Mesa} = (D_{Mesa1} + DM_{esa2})/2$ where $D_{Mesa1}$ denotes the width of the mesa region M at the level of the pn junction between the mesa region BV and the region 22 and $D_{Mesa2}$ denotes the width of the mesa region M at 80% depth of the trench structure 30.

In principle, initially the n-type doping in the region of the mesa M is comparatively low and lies between approximately $10^{15}$ cm⁻³ up to approximately $10^{17}$ cm⁻³. By contrast, the drain region D in the second semiconductor partial region 21 is comparatively highly n-doped, to be precise between approximately $10^{19}$ cm⁻³ and approximately $10^{20}$ cm⁻³. The source region S is likewise highly n-doped.

The advantage that can be obtained with the field buffer zone 23 can be seen from the profile of the electric field along a sectional line AA', which profile is illustrated on the left in FIG. 1: The field buffer zone permits the field profile to decay less steeply (cf. the dashed line without zone 23), as a result of which there is an increase in the integral over the field strength and hence the breakdown voltage. This increase is illustrated by the hatched area.

The gate electrode may comprise a plurality of electrodes G', E' (illustrated in dashed fashion) which may be at different potentials (gate, source).

Furthermore, there may be at least one local dopant maximum of the first conductivity type (n-type conduction) between body region and drain region.

In FIGS. 2A-C, the distributions of the electric field in the mesa regions M in the case of the prior art (FIG. 2A) with a normal mesa width Δ and in the case of the MOS transistor device 10 formed according to the invention with a mesa width $D_{Mesa}$ in the range $D_{Trench} \leq D_{Mesa} \leq 1.5 \cdot D_{Trench}$ and $2.5 \cdot D_{FOX} \leq D_{Mesa} \leq 7.5 \cdot D_{FOX}$ are compared with one another, where $D_{Trench}$ denotes the trench width of the trench structures 30 and $D_{FOX}$ denotes the maximum width of the field oxide FOX in the trench structure 30.

FIGS. 2A and 2B illustrate a MOS transistor device from the prior art and a MOS transistor device 10 according to the invention with a customarily dimensioned mesa width Δ and, respectively, with a mesa width $D_{Mesa}$ in the range $D_{Trench} \leq D_{Mesa} \leq 1.5 \cdot D_{Trench}$ and $2.5 \cdot D_{FOX} \leq D_{Mesa} \leq 7.5 \cdot D_{FOX}$. In this case, the lines each designate sections of areas with a constant magnitude of the electric field strength.

In the case of the prior art in accordance with FIG. 2A, a primary field strength maximum arises approximately in the cell center, that is to say between two adjacent MOS transistor devices, to be precise in the region of the contact hole, so that the avalanche breakdown is to be expected there. In the vertical course of the rest of the mesa, that is to say along the drift path, the electric field strength has an approximately constant profile in terms of magnitude. Above the field strength maximum and below the trench bottom 30b, the field strength decreases very rapidly to zero.

In contrast to this, on account of the great reduction of the mesa width $D_{Mesa}$ in the case of the MOS transistor device 10 according to the invention in accordance with FIG. 2B, the field strength magnitude maximum in the region of the cell center is greatly reduced, whereas a greatly pronounced field strength magnitude maximum is present in the region of the trench bottom 30b of the trench structure 30, to be precise in direct proximity to and adjoining the insulation region FOX, so that the avalanche breakdown is to be expected there.

FIG. 2C illustrates the profile of the magnitude of the electric field strength along the cell center in the mesa region M in dotted fashion for the prior art and as a solid line for the MOS transistor device according to the invention from FIG. 2B. A comparison reveals very clearly that, in the case of the prior art, the maximum field strength is present in the region of the contact hole, so that the avalanche breakdown is to be expected there, whereas in the case of the field strength profile according to the invention, the maximum is formed in the region of the trench bottom 30b, which may lead to an avalanche breakdown there.

Figure 3B:
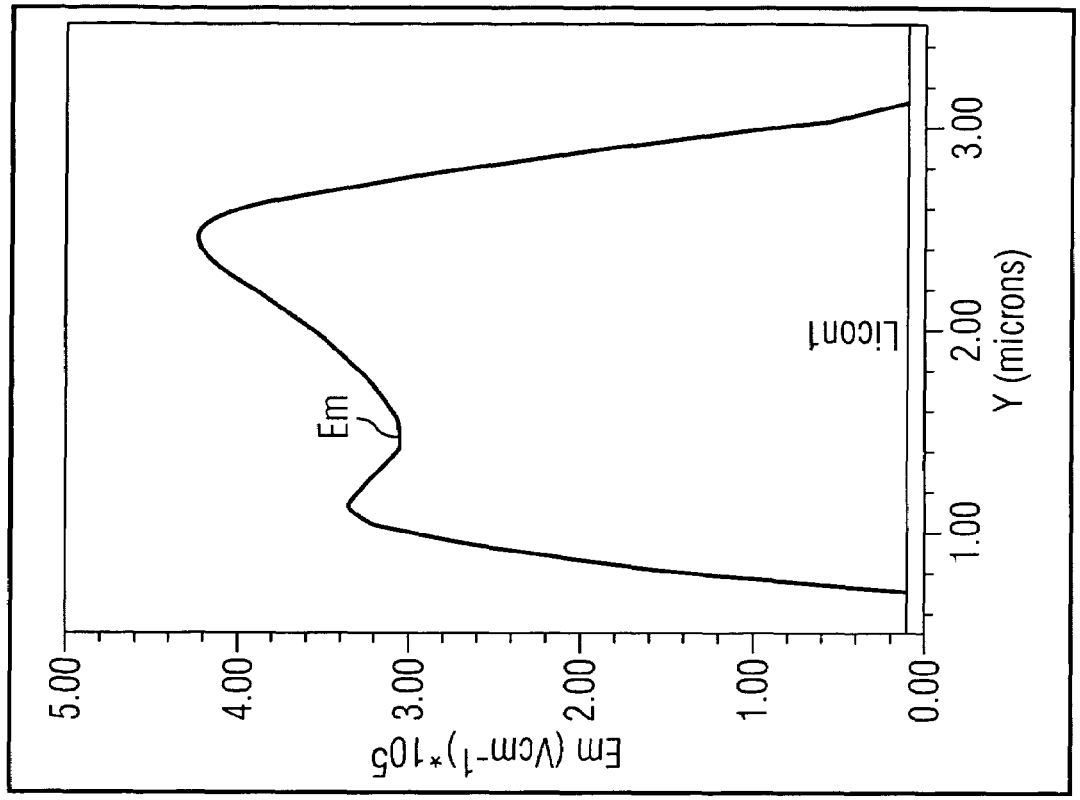
FIGS. 3A, 3B qualitatively illustrate the field strength distribution in another embodiment of the MOS transistor device according to the invention.
Figure 3A:
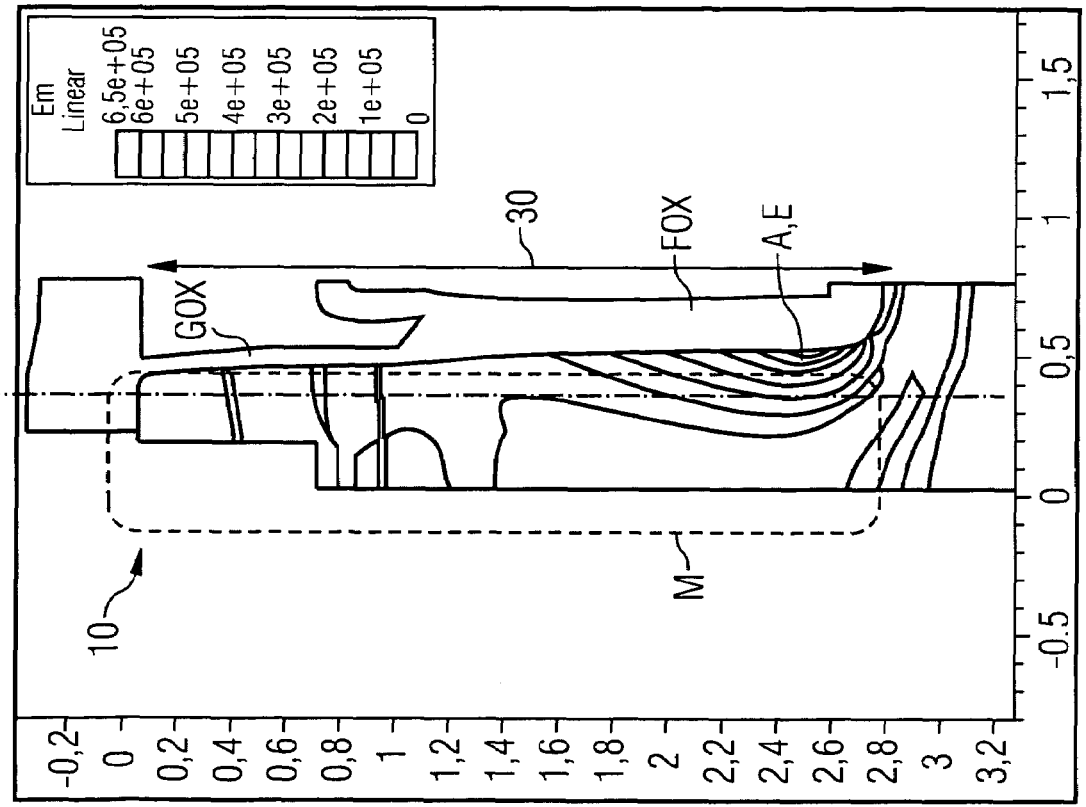

The diagrams of FIGS. 3A and 3B illustrate the typical field distributions of the electric field in the dense trench regime for an embodiment of the vertical trench MOS transistor device 10 according to the invention given a mesa width $D_{Mesa}$ that meets the condition $D_{Trench} \leq D_{Mesa} \leq 1.5 \cdot D_{Trench}$ and preferably additionally the condition $2.5 \cdot D_{FOX} \leq D_{Mesa} \leq 7.5 \cdot D_{FOX}$ in relation to the trench width $D_{Trench}$ and, respectively, in relation to the maximum thickness $D_{FOX}$ of the insulation region FOX. The field strength maximum E and thus the breakdown location A lie in the trench bottom region 30b, 30u of the trench structure 30.

The illustration of FIG. 3A is a sectional side view. FIG. 3B is a profile of the magnitude of the electric field strength along the line F from FIG. 3A.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A MOS field plate trench transistor device having a trench structure extending in a first direction in a semiconductor region comprising:
   a source region and a drain region formed in the semiconductor region with a first conductivity type and, between the source region and the drain region, a body region is formed with a second conductivity type, which is opposite to the first conductivity type;
   a gate electrode device formed in between in the interior of the trench structure in a manner insulated by an insulation region; and
   a mesa region is located in the semiconductor region as intermediate region in a direction running perpendicular to the first direction and with respect to an adjacent MOS transistor device has a width $D_{Mesa}$, the value of which corresponds to the value of the width $D_{Trench}$ of the trench structure in this direction or exceeds said value and does not go beyond 1.5 times said value, so that the following holds true:

$D_{Trench} \leq D_{Mesa} \leq 1.5 \cdot D_{Trench}$, where $D_{Mesa}$ is the average value of the width of the mesa region at the level of the pn junction between the body region and the drain region and the width of the mesa region at 80% of the depth of the trench structure and
      in which the mesa region is provided with a contact hole to the body region.

2. The MOS field plate trench transistor device of claim 1, wherein the avalanche breakdown region of the MOS transistor device is formed in a lower region of the trench structure.

3. The MOS field plate trench transistor device of claim 1, comprising wherein the width $D_{Mesa}$ and the width $D_{Trench}$ are in the following relationship with respect to the maximum thickness $D_{FOX}$ of the insulation region:

$2.5 \cdot D_{FOX} < D_{Trench} \leq D_{Mesa} \leq 7.5 \cdot D_{FOX}$.

4. The MOS field plate trench transistor device of claim 1, comprising wherein the contact hole is formed globally along the trench structure.

5. The MOS field plate trench transistor device of claim 1, comprising wherein a body reinforcement region is formed locally in regions of the contact hole.

6. A MOS field plate trench transistor device having a trench structure extending in a first direction in a semiconductor region, comprising:
   a source region and a drain region formed in the semiconductor region with a first conductivity type and, between the source region and the drain region, a body region is formed with a second conductivity type, which is opposite to the first conductivity type;
   a gate electrode device is formed in between in the interior of the trench structure in a manner insulated by an insulation region;
   a mesa region having a width $D_{Mesa}$ in the semiconductor region as intermediate region in a direction running perpendicular to the first direction and with respect to an adjacent MOS transistor device has a width $D_{Mesa}$; and
   wherein the mesa region is provided with a contact hole to the body region, wherein the width $D_{Mesa}$ is chosen such that, it is reduced to such a great extent that an avalanche breakdown occurs in the bottom region of the trench structure, and that it is reduced only to an extent such that the contact hole still has space.

7. The MOS field plate trench transistor device of claim 6, comprising wherein the width $D_{Mesa}$ and the width $D_{Trench}$ are in the following relationship with respect to the maximum thickness $D_{FOX}$ of the insulation region:

$2.5 \cdot D_{FOX} < D_{Trench} \leq D_{Mesa} \leq 7.5 \cdot D_{FOX}$.

8. The MOS field plate trench transistor device of claim 6, comprising wherein the contact hole is formed globally along the trench structure.

9. The MOS field plate trench transistor device of claim 6, comprising wherein a body reinforcement region is formed locally in regions of the contact hole.

10. The MOS field plate trench transistor device of claim 6, comprising wherein the body region is formed such that it is reinforced toward the drain region with a body reinforcement region of the second conductivity type.

11. The MOS field plate trench transistor device of claim 6, comprising wherein the avalanche breakdown region of the MOS transistor device is formed by a region of maximum electric field strength.

12. The MOS field plate trench transistor device of claim 11, comprising wherein the region of maximum electric field strength is formed between the source region and the drain region in direct proximity to the insulation region and to the end region or to the lower region of the trench structure in a manner facing away from the gate electrode device.

13. The MOS field plate trench transistor device of claim 11, comprising wherein the region of maximum electric field strength is formed between the source region and the drain region in direct proximity to the end region or to the lower region of the trench structure and in a manner facing away from the gate electrode device in the region of a space charge zone, which is formed when a breakdown voltage is present between a provided body region or body reinforcement region and the drain region, in a half thereof which faces the drain region.

14. The MOS field plate trench transistor device of claim 6, comprising wherein the trench structure is formed such that it reaches approximately as far as a first semiconductor subregion of the semiconductor region or into the semiconductor subregion.

15. The MOS field plate trench transistor device of claim 6, comprising wherein the semiconductor region has a field buffer zone.

16. The MOS field plate trench transistor device of claim 15, comprising wherein the field buffer zone is formed between a first semiconductor subregion and a second semiconductor subregion.

17. The MOS field plate trench transistor device of claim 15, comprising wherein the trench structure is formed such that it reaches approximately as far as the field buffer zone or into the field buffer zone.

18. The MOS field plate trench transistor device of claim 6, comprising wherein the gate electrode device comprises a plurality of electrodes.

19. The MOS field plate trench transistor of claim 18, comprising wherein the plurality of electrodes are at a plurality of different potentials.

20. The MOS field plate trench transistor device of claim 19, comprising wherein the different potentials are gate potential and source potential.

21. The MOS field plate trench transistor device of claim 6, comprising wherein at least one local dopant maximum of the first conductivity type is formed in the zone between body region and drain region.

22. The MOS field plate trench transistor device of claim 6, comprising wherein the drain region or the connection region therefor, whilst avoiding to the greatest possible extent a rear-side contact-connection of the semiconductor region, is formed on the same side of the semiconductor region as the source region or the connection region therefor.

23. A MOS field plate trench transistor device having a trench structure extending in a first direction in a semiconductor region comprising:

a source region and a drain region formed in the semiconductor region with a first conductivity type and, between the source region and the drain region, a body region is formed with a second conductivity type, which is opposite to the first conductivity type;

a gate electrode device formed in between in the interior of the trench structure in a manner insulated by an insulation region; and means for providing a mesa region is located in the semiconductor region as intermediate region in a direction running perpendicular to the first direction and with respect to an adjacent MOS transistor device has a width $D_{Mesa}$, the value of which corresponds to the value of the width $D_{Trench}$ of the trench structure in this direction or exceeds said value and does not go beyond 1.5 times said value, so that the following holds true:

$$D_{Trench} \leq D_{Mesa} \leq 1.5 \cdot D_{Trench'}$$

where $D_{Mesa}$ is the average value of the width of the mesa region means at the level of the pn junction between the body region and the drain region and the width of the mesa region at 80% of the depth of the trench structure and in which the mesa region is provided with a contact hole to the body region.

* * * * *